United States Patent [19]

Bukhman et al.

[11] Patent Number: 4,560,436

[45] Date of Patent: Dec. 24, 1985

[54] PROCESS FOR ETCHING TAPERED POLYIMIDE VIAS

[75] Inventors: Yefim Bukhman, Tempe; Steven C. Thornquist, Mesa, both of Ariz.

[73] Assignee: Motorola, Inc., Schaumburg, Ill.

[21] Appl. No.: 627,263

[22] Filed: Jul. 2, 1984

[51] Int. Cl.[4] .................. B44C 1/22; C03C 15/00; C03C 25/06; B29C 17/08

[52] U.S. Cl. .............................. 156/643; 156/646; 156/653; 156/655; 156/657; 156/659.1; 156/668; 204/192 E; 427/89; 357/71

[58] Field of Search ............ 156/643, 644, 646, 652, 156/653, 655, 657, 659.1, 661.1, 662, 668; 29/580; 204/164, 192 EC, 192 E; 427/38, 39, 88, 89–90, 91; 357/71; 430/313, 317

[56] References Cited

U.S. PATENT DOCUMENTS

| | | | |
|---|---|---|---|
| 4,367,119 | 1/1983 | Logan et al. | 156/644 X |
| 4,409,319 | 10/1983 | Colacino et al. | 156/647 X |
| 4,487,652 | 12/1984 | Almgren | 156/643 |
| 4,495,220 | 1/1985 | Wolf et al. | 156/653 X |

FOREIGN PATENT DOCUMENTS 0013372  2/1978  Japan .................................. 156/652

*Primary Examiner*—William A. Powell

*Attorney, Agent, or Firm*—Michael D. Bingham

[57] ABSTRACT

A polyimide-oxide-polyimide integrated circuit structure is utilized in the process for forming openings having tapered sidewalls and predetermined controlled sizes. At least one opening size is replicated and transferred to an exposed surface in a underlying surface of the structure by first forming a thick layer of oxide over the first cured polyimide layer, anisotropically etching the thick layer of oxide to form an opening of predetermined size therethrough to the surface of the first cured polyimide layer. Next, the first layer of cured polyimide is isotropically etched to form an opening therethrough of substantially said predetermined size and exposing a portion of a thin layer of oxide underlying the first layer of cured polyimide. The thin layer of oxide is then anisotropically etched using the thick layer of oxide as an etch mask to expose an opening of said predetermined size on a surface of a second layer of cured polyimide. The second layer of cured polyimide is then anisotropically etched again using the thick layer of oxide as the etch mask to transfer and replicate the opening in the thick layer onto the surface of the underlying region. Thereafter the thick layer of oxide is removed. Metalization can then be deposited on the resulting structure to make contact to the underlying surface.

2 Claims, 6 Drawing Figures

PROCESS FOR ETCHING TAPERED POLYIMIDE VIAS

BACKGROUND OF THE INVENTION

The present invention relates to the fabrication of integrated circuits and, more particularly, to the fabrication of integrated circuits having multilayer structures interconnected by vias (openings) etched through a polyimide layer separating such layers. Specifically, the invention relates to a process for transferring an aperture formed in a photoresist masking layer to a subsurface layer of an integrated circuit using a tapered opening etched in a polyimide layer.

The advent of very large scale integrated circuits (VLSI) and very high speed integrated circuits (VHSIC) technologies have placed stringent demands on very fine line geometry semiconductor devices as well as multilayer metal schemes requiring attendant multilayer interconnect systems. In the fabrication of semiconductor devices of high density and high complexity, it is necessary to shrink the size and spacing of device features. It is also necessary or desirable to use thick layers of insulating material to isolate between the semiconductor substrate and overlying metal layer or between multiple interconnect metal layers. Polyimide layers, in which a liquid material is applied to the surface of the semiconductor substrate and subsequently heat treated to cure or form the polyimide material, are well suited to the function of forming an insulating layer. The use of thick polyimide insulating layers, and especially on small geometry devices, presents a problem with metal continuity into contact openings. To provide desired electrical contact between interconnect layers, contact openings must be formed through the polyimide material. Metal is then applied over the device and into these contact openings. Because the polyimide may be thick, it is difficult to achieve reliable metal coverage over the peripheral walls of the contact openings to the underlying material. Metal step coverage problems are enhanced by the need for the metal patterns to consist of thin and very narrow metal strips to allow fine geometry patterning. To insure reliability utilizing step coverage into openings through the thick polyimide layer, it is imperative that the edges of the opening be tapered. It is also important, however, that the size of the opening be carefully controlled. The latter requirement results partially from the fact that the lower metal surface or device region being contacted may be small and precisely placed. If the size of the opening or via is not controlled and the opening through the polyimide material is too large, then subsequently applied metal may cause shorting between adjacent device regions. There are a number of processes which provide for either the tapering of the walls of the opening or for the control of the critical dimensions thereof, however, there has not been a production campatible etching process which simultaneously achieves both of these necessary features.

Thus, during the fabrication of fine line geometry integrated circuits, a need exists for a process to etch tapered openings through a thick insulating layer to transfer critical openings to a subsurface layer of the integrated circuit.

BRIEF SUMMARY OF THE INVENTION

Accordingly, it is an object of the present invention to provide an improved method of etching tapered openings through a thick insulating layer of material comprising a portion of an integrated circuit.

It is another object of the invention to provide a process for etching an opening through a polyimide layer wherein the opening has tapered sidewalls and is controlled in size.

Still another object of the invention is to provide an improved process for fabricating a semiconductor device including the etching of contact openings through a polyimide layer.

In accordance with the above and other objects there is provided a process for etching dimensionally controlled and tapered polyimide vias (openings) during the fabrication of semiconductor devices utilizing differential etching process steps.

A feature of the embodiment of the invention is that a first layer of cured polyimide is formed overlying a sub-surface of a semiconductor substrate which is to be exposed. A first layer of oxide is then formed overlying the first layer of cured polyimide and a second layer of cured polyimide is then formed overlying this first layer of oxide. A second layer of oxide is then formed overlying the second layer of cured polyimide material. A masking layer is applied over the second oxide layer which is selectively patterned with openings therethrough using conventional photo etching processes which openings are to be replicated at the top surface of the underlying sub-surface layer of the semiconductor device thereby making contact openings thereto. Using the masking layer as an etch mask the second oxide layer is etched anisotropically. The masking layer is removed as the second layer of cured polyimide is isotropically etched through the opening in the second oxide layer to provide a via therethrough. By isotropically etching the second layer of cured polyimide tapered sidewalls are formed as the opening is etched therethrough. The etchant used for the isotropic etching is selective and stops at the first oxide layer which acts as an etch stop for all vias being simultaneously etched in the semiconductor device. The first oxide layer is then etched anisotropically using the second oxide layer as an etch mask whereby the dimensions of the opening in the second oxide layer is transferred to the upper surface of the first layer of cured polyimide material. The first layer of cured polyimide material is next etched anisotropically using the first oxide layer as an etch mask to provide the contact opening on the exposed upper surface of the underlying sub-surface layer of the semiconductor device. This contact opening has essentially the same dimensions and replicates the opening formed in the second oxide layer by the photomasking layer. The second oxide layer is then etched away to allow contact to the exposed portion of the underlying sub-surface layer through the tapered via of the second polyimide layer. Metal or other types of semiconductor material may then be deposited through the openings or formed through the polyimide layers to contact the sub-surface layer of the semiconductor device.

DETAILED DESCRIPTION OF THE PREFERRED EMBODIMENT

Figure 1:
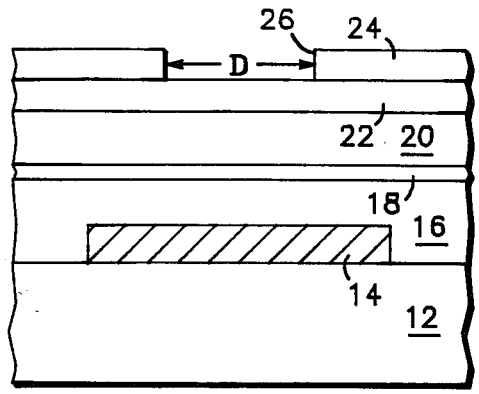
FIGS. 1-6 are cross-sectional views of a portion of a semiconductor device or integrated circuit fabricated by the process steps of the present invention.

FIG. 1 illustrates a cross-sectional view of a portion of a semiconductor device or integrated circuit (IC) 10 formed of multiple layers 14–22 on substrate 12 using conventional deposition techniques such as plasma deposition. As shown, IC 10 may be a high density complex IC wherein multilayer interconnects are required between the upper surface of the IC and sub-surface regions therein. For instance, IC 10 may consist of a first metal layer 14 deposited on the upper surface of substrate 12 which comprises a semiconductor material of a first conductivity type. A first layer 16 of cured polyimide material is formed overlying sub-surface layer 14 having an upper planar surface upon which a thin first layer 18 of oxide material is formed. Oxide layer 18 which may be deposited $SiO_2$ material or any other material commonly used in the manufacture of integrated circuits, is formed over the upper planar surface of polyimide layer 16. A second layer 20 of cured polyimide material is formed over the upper planar surface of thin oxide layer 18. A second layer 22 of oxide material is then formed over the upper planar surface of cured polyimide layer 20. The aforedescribed structure forms the IC structure 10 consisting of a polyimide-oxide-polyimide-oxide layered structure which overlays sub-surface region 14 which, as aforementioned, may be an internal metal run of very fine line dimensions or a portion of a semiconductor device of small dimension.

In order to make metal contact to region 14 it is important that any openings formed through the layered structure described above be dimensionally controlled since in VLSI or VHSIC circuits the dimension D of opening 26 will be of minimal size. Thus, maintaining the predetermined size of this opening assures that this opening is alligned with sub-surface region 14 and does not overlap the edge thereof which otherwise may present electrical shorting problems. The following explanation describes a process for transferring the opening from the upper planar surface of IC 10 to sub-surface region 14 in which the dimension of the opening is replicated on the planar surface of region 14.

As illustrated in FIG. 1, in accordance with the present invention, a layer 24 of resist material is formed overlying oxide layer 22 with this resist layer being selectively patterned to have openings 26 of predetermined dimensions, i.e., diameters D. Layer 24 may be of photoresist or the like and openings 26 may be formed therein using conventional photoetching processes to expose the underlying upper surfaces of oxide layer 22.

Figure 2:
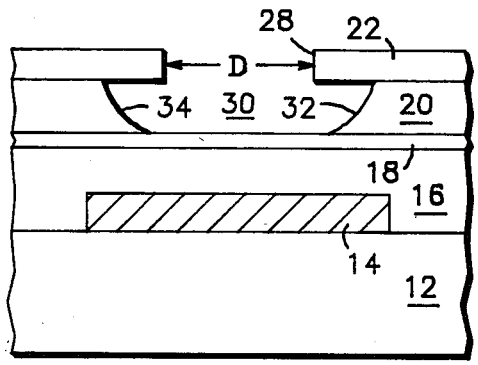

Photoresist layer 24 is used as an etch mask layer for masking oxide layer 22 while layer 22 is anisotropically etched by reactive ion etching, for example, in a fluorinated carbon gas atmosphere. As illustrated in FIG. 2, openings 26 are replicated in oxide layer 20. The critical dimension D is maintained as openings 28 are etched through oxide layer 22. Etching may take place in a dry plasma atmosphere using, for example, a commercially available plasma etcher such as the AME-8110 etcher manufactured by Applied Materials. Next, by changing chemistry in the etcher to a predominantly oxygen atmosphere, cured polyimide layer 20 is isotropically etched forming an undercut beneath overlying oxide layer 22 which acts as the etch mask therefor during this process step. Isotropically etching cured polyimide layer 20 forms a via 30 therethrough which has uniformed tapered sidewalls 32 and 34. Very thin oxide layer 18 acts as an etch stop so that everywhere in IC 10 where photoresist layer 24 has been selectively patterned with an opening, a tapered via is etched through cured polyimide layer 20 to the same depth i.e., to the upper surface of oxide layer 18. Photoresist layer 24 is etched away during this process step.

Figure 3:
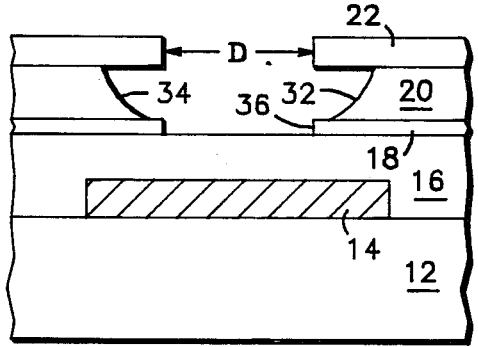

The next step in the process of the present invention is to anisotropically etch through oxide layer 18 using oxide layer 22 as an etch mask to replicate openings 28 therethrough to expose the upper surface of cured polyimide layer 16 (FIG. 3). To etch oxide layer 18, the chemistry of the plasma etch step is conducted once again in a fluorinated gas atmosphere.

Figure 4:
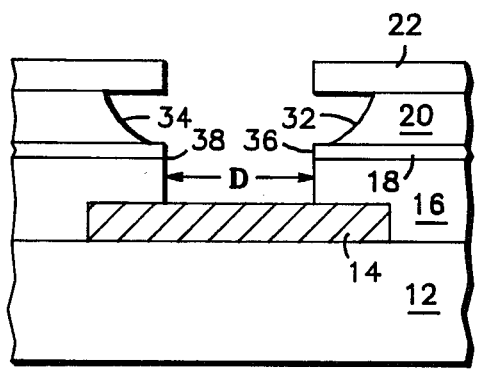

As illustrated in FIG. 4, cured polyimide layer 16 is then anisotropically etched in an oxygen atmosphere using remaining oxide layer 22 as the etch mask therefor. Again, the anisotropic etching can be done, for example, by reactive ion etching. Thus, etching of cured polyimide layer 16 allows the exact transfer of critical dimension D from the opening in the original photoresist layer 24 through cured polyimide layer 16 to expose the upper surface of sub-surface region 14 as desired.

Figure 5:
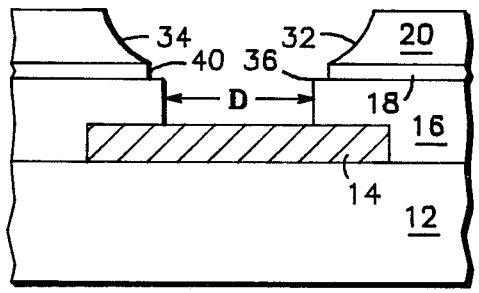
Figure 6:
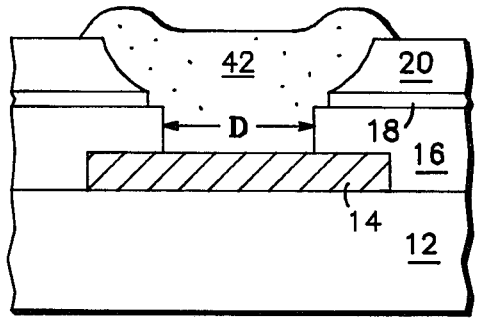

As shown in FIG. 5 the next step is to completely etch away oxide layer 22 while simultaneously removing the exposed area of oxide layer 18 overlying cured polymide layer 16. This is accomplished by utilizing fluorine gas base reactive ion etching, for example. Hence, an enlarged opening 40 is formed in thin oxide layer 18 prior to metalization of IC 10.

Finally, if, for example, region 14 is metal, i.e., a metal conductive run which is to be interconnected to an upper level metal contact, metalization 42 can then be applied over the polyimide isolated IC structure to provide the desired contact through opening 38.

By way of example only, IC 10 may be formed of the above described layers having the following respective thickness:

sub-surface region 14: approximately 0.7 microns
polyimide layer 16: approximately 1.0 microns
oxide layer 18: approximately 0.05 microns
polyimide layer 20: approximately 1.0 microns
oxide layer 22: approximately 0.25 microns Further, the above described etch steps may be conducted utilizing the following process chemistries and the AME-8110 etcher:

| I. Anisotropic etch of oxide layer 22 | |
|---|---|
| $CHF_3$ | 75 standard cubic centimeters per minutes (sccm) |
| $CO_2$ | 16 sccm |
| 65 | mTorr |
| 1100 | watts |
| 8 minutes | |
| II. Isotropic etch of polyimide layer 20 | |
| $O_2$ | 75 sccm |
| $CHF_3$ | 15 sccm |
| 150 | mTorr |
| 280 | Vdc |
| 14 minutes | |
| III. Anisotropic etch of oxide layer 18 | |
| $CHF_3$ | 75 sccm |
| $CO_2$ | 16 sccm |
| 65 | mTorr |
| 1100 | watts |
| 2 minutes | |
| IV. Anisotropic etch of polyimide layer 16 | |
| $O_2$ | 40 sccm |
| 10 | mTorr |

| -continued | |
| --- | --- |
| 700 | Vdc |
| 12.5 minutes | |
| V. Etch removal of oxide layers 22 and 18 | |
| CHF$_3$ | 75 sccm |
| CO$_2$ | 16 sccm |
| 1100 | watts |
| 6 minutes | |

Thus, in accordance with the invention, there is provided a process and structure for patterning of multiple cured polyimide layers for the fabrication of semiconductor devices having multiple contacting layers. The process produces dimensionally controlled openings between upper and lower connected layers suitable for use in fine line semiconductor process technologies and further produces well controlled vias through a polyimide layer having tapered sidewalls. A feature of the invention lies in the utilization of a thin oxide layer sandwiched between two thick cured polyimide layers which serves as the etch stop.

We claim:

1. A method for forming an opening through a polyimide layer to expose an underlying surface wherein the dimension of the opening exposing the underlying surface is controlled and is characterized by tapered sidewalls, comprising the steps of forming a first layer of cured polyimide on the underlying surface; forming a thin layer of oxide over said first layer of cured polyimide; forming a second layer of polyimide over said thin layer of oxide; forming a second layer of oxide over said second layer of polyimide; forming a masking layer over said second layer of oxide; selectively patterning said masking layer thereby forming at least one opening therethrough to expose a portion of said second layer of oxide wherein said at least one opening being of predetermined size; anisotropically etching said second layer of oxide exposed through said masking layer to expose a portion of said second layer of cured polyimide underlying said at least one opening; isotropically etching said second layer of cured polyimide using said second layer of oxide as an etch mask to form an opening exposing a portion of said first layer of oxide wherein said opening through said second layer of cured polyimide having tapered sidewalls and said exposed portion of said first layer of oxide being an opening of substantially the same dimensions as said at least one opening, said first layer of oxide acting as an etch stop; anisotropically etching said first layer of oxide using said second layer of oxide as an etch mask to expose an opening to said first layer of cured polyimide; anisotropically etching said first layer of cured polyimide using said second layer of oxide as an etch mask to form an opening of said predetermined size on the underlying surface.

2. The method of claim 1 further including the steps of removing said masking layer simultaneously with etching said second layer of cured polyimide and removing said second layer of oxide after said predetermined opening is formed on the underlying surface.

* * * * *